(12) United States Patent
Houle et al.

(10) Patent No.: US 7,030,485 B2
(45) Date of Patent: Apr. 18, 2006

(54) THERMAL INTERFACE STRUCTURE WITH INTEGRATED LIQUID COOLING AND METHODS

(75) Inventors: Sabina J. Houle, Phoenix, AZ (US); James Christopher Matayabas, Jr., Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/607,734

(22) Filed: Jun. 26, 2003

(65) Prior Publication Data

US 2004/0262743 A1 Dec. 30, 2004

(51) Int. Cl.
*H01L 23/34* (2006.01)
(52) U.S. Cl. ............... 257/712; 257/706; 257/714; 257/717
(58) Field of Classification Search ........... 257/706, 257/707, 710, 712, 713, 717; 165/80.2–80.4; 361/704, 705, 708–709, 718–720, 722, 736–737, 361/742, 706, 712, 714, 717
See application file for complete search history.

(56) References Cited

U.S. PATENT DOCUMENTS

| | | | | |
|---|---|---|---|---|
| 5,146,314 A | * | 9/1992 | Pankove | 257/712 |
| 5,291,371 A | * | 3/1994 | Gruber et al. | 361/705 |
| 5,798,566 A | * | 8/1998 | Sato et al. | 257/712 |
| 5,907,189 A | * | 5/1999 | Mertol | 257/787 |
| 6,111,322 A | * | 8/2000 | Ando et al. | 257/778 |
| 6,172,415 B1 | * | 1/2001 | Ishijima et al. | 257/707 |
| 6,292,369 B1 | * | 9/2001 | Daves et al. | |
| 6,295,200 B1 | * | 9/2001 | Schmidt | 361/704 |
| 6,667,548 B1 | * | 12/2003 | O'Connor et al. | 257/712 |
| 6,791,839 B1 | * | 9/2004 | Bhagwagar | 361/705 |
| 2004/0190263 A1 | * | 9/2004 | Jadhav et al. | |

* cited by examiner

*Primary Examiner*—George Fourson
*Assistant Examiner*—Joannie Adelle Garcia
(74) *Attorney, Agent, or Firm*—Schwegman, Lundberg, Woessner & Kluth, P.A.

(57) ABSTRACT

A method and device for thermal conduction is provided. A thermal interface device and method of formation is described that includes advantages such as improved interfacial strength, and improved interfacial contact. Embodiments of thermal conduction structures are shown that provide composite thermal conduction and circulated liquid cooling. Embodiments are further shown that require simple, low numbers of manufacturing steps and reduced thermal interface thickness.

9 Claims, 6 Drawing Sheets

THERMAL INTERFACE STRUCTURE WITH INTEGRATED LIQUID COOLING AND METHODS

TECHNICAL FIELD

The present invention relates generally to the field of heat transfer and, in particular, the present invention relates to thermal management of electronic devices.

BACKGROUND

In one embodiment, the present invention is used to transfer heat generated by electronic devices or groups of devices, such as transistors, as are commonly included on integrated circuit (IC) chips such as processor chips.

In the field of electronic systems there is an incessant competitive pressure among manufacturers to drive the performance of their equipment up while driving down production costs. This is particularly true regarding forming electronic devices such as transistors in IC's, where each new generation of IC must provide increased performance, particularly in terms of an increased number of devices and higher clock frequencies, while generally being smaller or more compact in size. As the density and clock frequency of IC's increase, they accordingly generate a greater amount of heat. However, the performance and reliability of IC's are known to diminish as the temperature to which they are subjected increases, so it becomes increasingly important to adequately dissipate heat from IC environments.

With the advent of high performance IC's and their associated packages, electronic devices have required more innovative thermal management to dissipate heat. Increasing speed and power in processors, for example, generally carry with it a "cost" of increased heat in the microelectronic die that must be dissipated. What is needed is a device and method to more effectively cool microelectronic dies containing IC's such as processors. What is also needed is a device and method that is less expensive and easier to manufacture.

DETAILED DESCRIPTION

Figure 1:
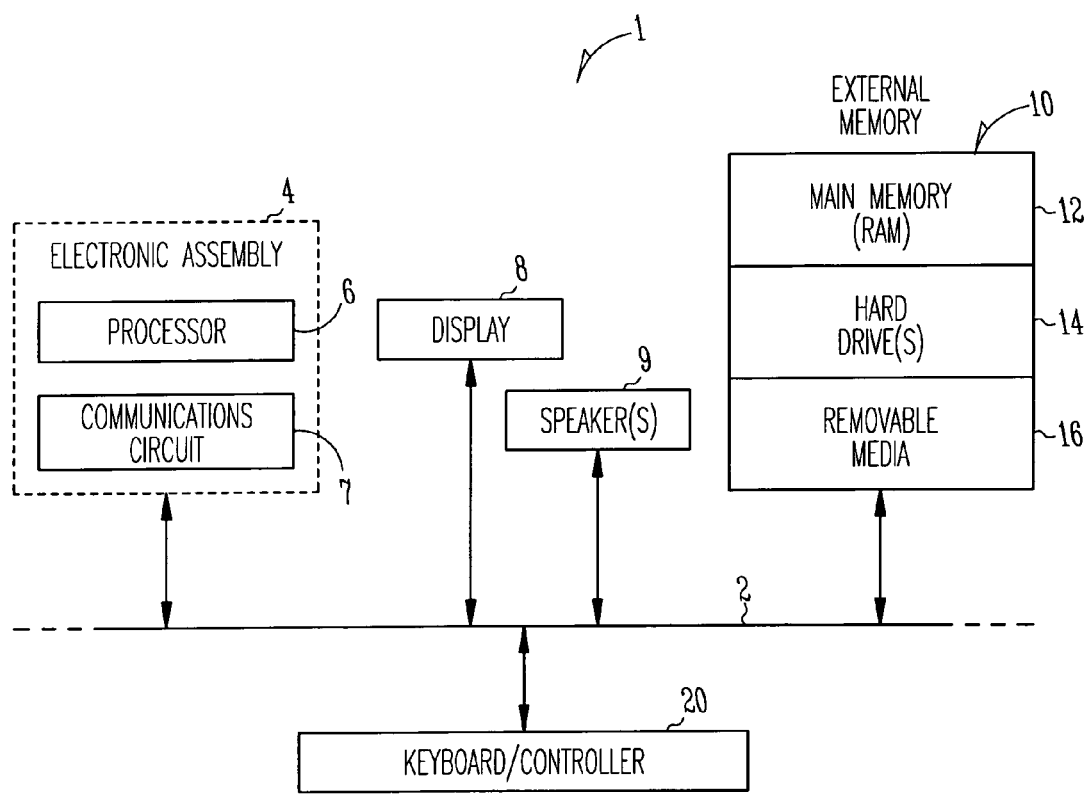
FIG. 1 illustrates an information handling device according to one embodiment of the invention.

In the following detailed description of the invention reference is made to the accompanying drawings which form a part hereof, and in which are shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized, and structural, logical, and electrical changes may be made, without departing from the scope of the present invention. The following detailed description is, therefore, not to be taken in a limiting sense, and the scope of the invention should be determined with reference to the appended claims, along with the full scope of equivalents to which such claims are entitled.

The term "active side" as used in this description is defined as the conventional horizontal, large plane or surface of a chip or die where electrical devices have typically been fabricated, regardless of the orientation of the chip or die. The term "back side" as used in this description is defined as a conventional horizontal, large plane or surface of a chip or die that generally does not contain active devices on its surface. The term "vertical" refers to a direction perpendicular to the horizontal as defined above. Prepositions, such as "on", "higher", "lower", "above" and "below" are defined with respect to the conventional plane or surface being on the active side of the chip or die, regardless of the orientation of the chip or die.

An example of an information handling system using processor chips is included to show an example of a higher level device application for the present invention. FIG. 1 is a block diagram of an information handling system 1 incorporating at least one electronic assembly 4 utilizing a thermal interface structure in accordance with at least one embodiment of the invention. Information handling system 1 is merely one example of an electronic system in which the present invention can be used. In this example, information handling system 1 comprises a data processing system that includes a system bus 2 to couple the various components of the system. System bus 2 provides communications links among the various components of the information handling system 1 and can be implemented as a single bus, as a combination of busses, or in any other suitable manner.

Electronic assembly 4 is coupled to system bus 2. Electronic assembly 4 can include any circuit or combination of circuits. In one embodiment, electronic assembly 4 includes a processor 6 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Other types of circuits that can be included in electronic assembly 4 are a custom circuit, an application-specific integrated circuit (ASIC), or the like, such as, for example, one or more circuits (such as a communications circuit 7) for use in wireless devices like cellular telephones, pagers, portable computers, two-way radios, and similar electronic systems. The IC can perform any other type of function.

Information handling system 1 can also include an external memory 10, which in turn can include one or more memory elements suitable to the particular application, such as a main memory 12 in the form of random access memory (RAM), one or more hard drives 14, and/or one or more drives that handle removable media 16 such as floppy diskettes, compact disks (CD), digital video disk (DVD), and the like. Examples of main memory 12 include dynamic random access memory (DRAM), synchronous dynamic random access memory (SDRAM), flash memory, static random access memory (SRAM), etc.

Information handling system 1 can also include a display device 8, one or more speakers 9, and a keyboard and/or controller 20, which can include a mouse, trackball, game controller, voice-recognition device, or any other device that permits a system user to input information into and receive information from the information handling system 1.

Although the present invention is found to be effective at transferring heat from IC surfaces, the invention is not limited to heat transfer from IC surfaces. The invention can be used in any setting where heat is to be conducted from one surface to another. For ease of explanation, the example of cooling an IC will be used.

Figure 2A:
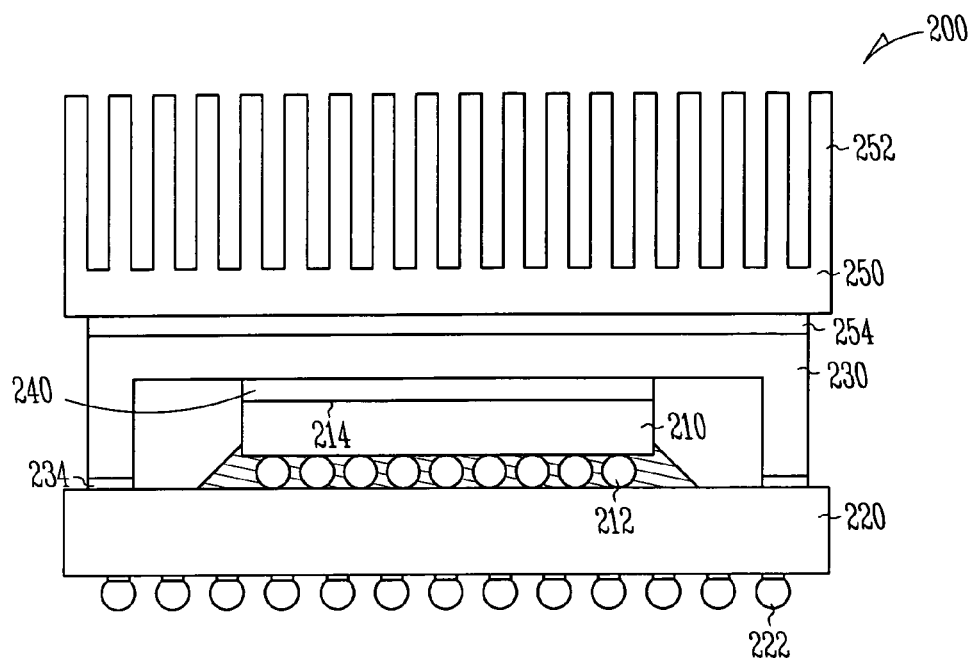
FIG. 2A illustrates a side view of a processor assembly according to one embodiment of the invention.

FIG. 2A shows a cross-sectional representation of an IC package 200. In embodiments where the IC die is a processor die, the IC package can be termed a processor assembly. IC package 200 includes an IC die 210 mounted in "flip-chip" orientation with its active side facing downward to couple with an upper surface of a substrate 220, such as a circuit board, through solder balls or bumps 212. Substrate 220 can be a one-layer board or a multi-layer board, and it can include additional contacts 222 on its opposite surface for mating with additional packaging structure (not shown).

Die 210 generates its heat from internal structure, including wiring traces, that is located near its active side; however, a significant portion of the heat is dissipated through its back side 214. Heat that is concentrated within the die is dissipated to a large surface that is in contact with the die in the form of an integrated heat spreader 230 that is typically formed of metal such as copper or aluminum. In one embodiment, the integrated heat spreader 230 is formed into a partial enclosure, and serves as a package cover for the die 210. In one embodiment, a sealant 234 is further included to isolate and secure the integrated heat spreader 230 to the substrate 220. To improve the thermal conductivity between the die 210 and the integrated heat spreader 230, a thermal interface material 240 is often provided between the die 210 and integrated heat spreader 230.

In one embodiment, to further dissipate heat from the integrated heat spreader 230, a heat sink 250 optionally having fins 252 is coupled to the integrated heat spreader 230. Heat sink 250 dissipates heat into the ambient environment. In one embodiment a second thermal interface material 254 is further utilized to create a thermal pathway between the integrated heat spreader 230 and the heat sink 250.

The thermal interface material 240 shown in FIG. 2A is intended to be a general illustration of a thermal interface material or thermal interface structure. In the following detailed description, specific details of thermal interface structures and assemblies are illustrated for given embodiments of the invention.

Figure 2B:
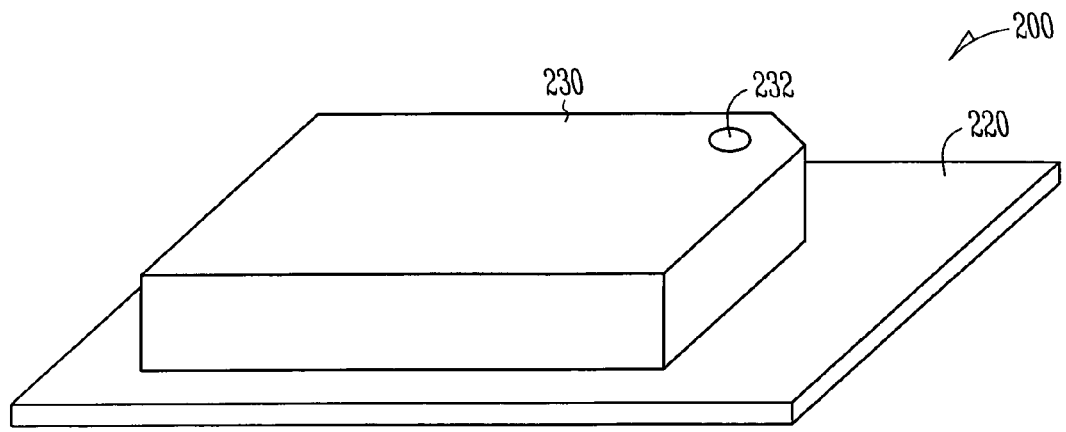
FIG. 2B illustrates an isometric view of a processor assembly according to one embodiment of the invention.

FIG. 2B shows an embodiment of an IC package 200 without an additional heat sink 250 attached as described above. The integrated heat spreader 230 is shown in an embodiment formed as a package cover. The edges of the integrated heat spreader 230 form an enclosure with the substrate 220 where the die (not shown) is substantially enclosed. In one embodiment, an opening 232 is included in the integrated heat spreader 230. In one embodiment, the opening 232 provides a relief for variations in pressure due to thermal changes in the die.

Figure 3A:
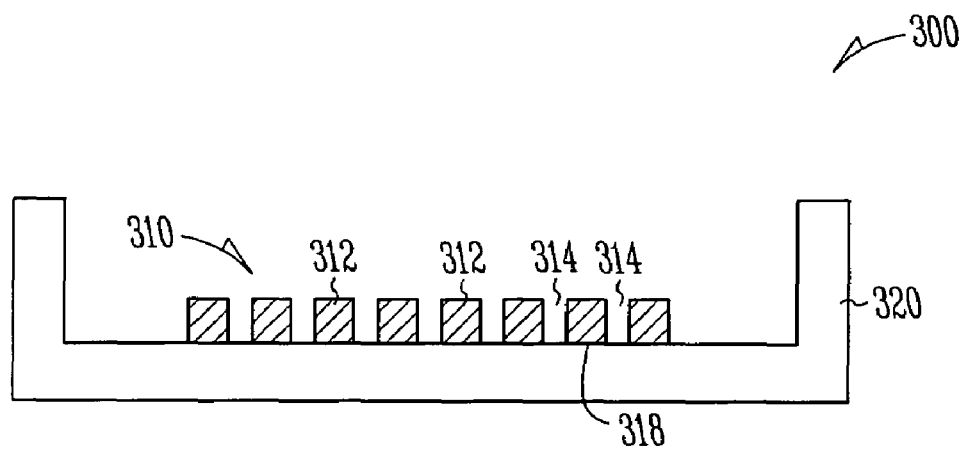
FIG. 3A illustrates a side view of an integrated circuit assembly according to one embodiment of the invention.

FIG. 3A shows a heat conducting assembly 300, including a heat spreader 320 and a thermal interface structure 310. In one embodiment, the heat spreader 320 includes an integrated circuit package cover, although the invention is not so limited. In one embodiment, the heat spreader 320 includes an integrated heat spreader. In one embodiment the heat spreader 320 includes the material copper, although other heat conducting materials, such as aluminum or AlSiC are within the scope of the invention. In one embodiment, the heat spreader 320 is coated with nickel (Ni) on at least a portion of its exterior surfaces to provide desirable chemical interaction properties, such as with its environment, or other components.

The thermal interface structure 310 of FIG. 3A includes a number of guide structures 312 and a number of spaces 314. In embodiments that will be described below, the number of guide structures 312 and the number of spaces 314 are used to conduct a fluid within the thermal interface structure 310 to enhance thermal conduction within the thermal interface structure 310. In one embodiment, the number of guide structures includes a perimeter seal portion that will be described in more detail in sections below.

In one embodiment, the thermal interface structure 310 includes a material that is plastically deformable under certain conditions of temperature and pressure. An operation such as cold forming causes plastic deformation in materials at temperatures below their melting points. In one embodiment, the thermal interface structure 310 includes a metal. In one embodiment, the thermal interface structure 310 includes solder. Suitable materials for the thermal interface structure 310 include, but are not limited to tin (Sn), indium (In), and silver (Ag). Alloys of tin, indium and silver, with each other, or with other metals are also within the scope of the invention.

FIG. 3A further shows an interface 318 between the thermal interface structure 310 and the heat spreader 320. In one embodiment the interface 318 is formed at least partially using plastic deformation.

A noted above, in a deformation operation such as cold forming, at least a portion of the material being forrried deforms plastically. After cold forming the thermal interface structure 310 against the heat spreader 320, a number of cold formed features are observed at the interface 318. In one cold formed feature, the deformation causes the deforming portion of the material to flow in a conforming manner into surface features of the heat spreader 320. In this way, substantially all gaps present at the interface 318 are removed as the thermal interface structure 310 is deformed into surface features on the heat spreader 320.

In one embodiment, a cold formed feature includes a mechanical bond that is formed at the interface 318 during plastic deformation. In a mechanical bond, certain portions of the thermal interface structure 310 flow around asperities or surface features of the heat spreader 320. After deformation is complete, the interface 318 is at least partially held together mechanically by the asperities or surface features being embedded within the flowed portion of the thermal interface structure 310. This is in contrast to chemical bonding where actual bonds are formed between atoms of the thermal interface structure 310 and atoms of the heat spreader 320. In one embodiment, the interface 318 is roughened on the heat spreader 320 to enhance a mechanical bond. In one embodiment, a combination of chemical bonding, such as a formation of intermetallic compounds, and mechanical bonding are formed at the interface 318. For example, in embodiments where the heat spreader 320 includes a nickel coating, and the thermal interface structure 310 includes indium, an intermetallic compound of indium and nickel is formed.

In one embodiment, a cold formed feature includes work hardening of the thermal interface structure 310. The plastic deformation of portions of the thermal interface structure 310 acts to raise the hardness and strength of the thermal interface structure 310.

In one embodiment, the plastic deformation takes place below a melting temperature of the material being deformed. Once a material, such as the thermal interface structure 310, is in its liquid state, wetting of the liquid against the other surface, such as the heat spreader 320 becomes an issue. Due to chemical incompatibility, the liquid thermal interface structure 310 may not wet well against the heat spreader 320. In such circumstances, undesirable voids will form at the interface 318. The voids are undesirable because they do not conduct heat effectively, and they provide less effective mechanical strength at the interface 318. By maintaining the temperature below a melting temperature of the thermal interface structure 310, issues of wetting at the interface 318 are avoided.

In one embodiment, the plastic deformation takes place above ambient temperatures. As temperature increases, the strength of the thermal interface structure 310 decreases. In this way, the force necessary to cause plastic deformation can be adjusted by varying the temperature. By maintaining the temperature above ambient temperatures, plastic deformation is accomplished with lower forces, and the thermal interface structure 310 flows better into surface features of the heat spreader 320 with advantages such as better interface contact, and higher mechanical strength as discussed above. In one embodiment, the plastic deformation takes place at a temperature between approximately 130° C. and 145° C. In one embodiment, a load of approximately 20–100 pounds is used in the plastic deformation operation. In one embodiment, conditions such as temperature and load are sustained for approximately one minute during the plastic deformation operation. In embodiments using substantially pure indium, processing conditions of pressure and temperature are suited to plastic deformation without damage to other structures such as integrated circuit chips.

Figure 3B:
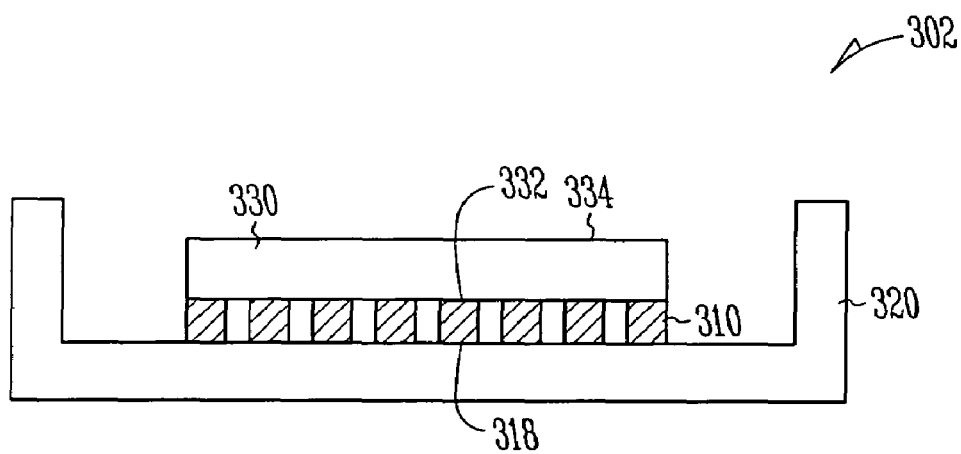
FIG. 3B illustrates a side view of an integrated circuit assembly according to one embodiment of the invention.

FIG. 3B shows a chip assembly 302 further including an integrated circuit chip 330. In one embodiment, the integrated circuit chip 330 includes a processor chip. A backside 332 of the integrated circuit chip 330 and an active side 334 of the integrated circuit chip 330 are further shown in FIG. 3B. In one embodiment, the integrated circuit chip 330 is mounted in flip-chip orientation, with the active side 334 up as illustrated in FIG. 3B.

In one embodiment, the thermal interface structure 310 is attached to the heat spreader 320 using methods described above prior to attaching the thermal interface structure 310 to the integrated circuit chip 330. In one embodiment, the thermal interface structure 310 is attached to the integrated circuit chip 330 using methods described above prior to attaching the thermal interface structure 310 to the heat spreader 320. In one embodiment, the thermal interface structure 310 is attached concurrently using methods described above to both the heat spreader 320 and the integrated circuit chip 330. Accordingly, selected embodiments include one or more interfaces of the thermal interface structure 310 (such as interface 318, or the opposite interface at the backside 332 of the integrated circuit chip 330) with cold formed features.

Figure 3C:
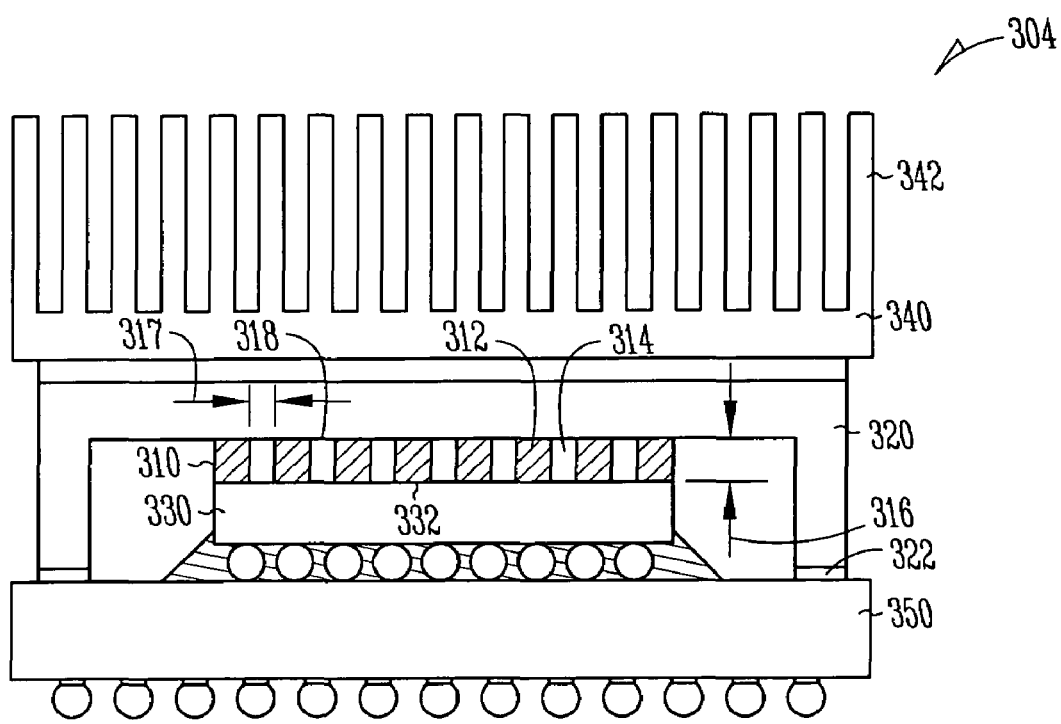
FIG. 3C illustrates a side view of a processor assembly according to one embodiment of the invention.

FIG. 3C shows a processor assembly 304. The heat spreader 320 is shown with the thermal interface structure 310 and a processor chip used as the integrated circuit chip 330. In the embodiment shown in FIG. 3C, a sealant 322 is shown between the heat spreader 320 and a substrate 350. A heat sink 340 is also shown with a number of fins 342. Other components are included in FIG. 3C that are similar to those illustrated in FIG. 2A.

FIG. 3C shows a thickness 316 of the thermal interface structure 310. In one embodiment, the thickness 316 is in a range of approximately 0.0025–0.0050 cm thick. In one embodiment, manufacturing methods such as cold forming at least one interface of the thermal interface structure 310 allows a thickness 316 to be reduced to the range of 0.0025–0.0050 cm. In one embodiment, the use of manufacturing methods such as cold forming on at least one interface of the thermal interface structure 310 allows a reduction in process steps such as formation of intermediate interface layers.

In selected embodiments, a liquid material is placed within the number of spaces 314 in the thermal interface structure 310. In one embodiment, the liquid material includes a liquid metal material. In one embodiment, the liquid material includes liquid gallium metal. Gallium metal is liquid at ambient temperatures (around 30° C.), and is a good conductor of heat at approximately 41 W/mK. Other liquid materials aside from gallium or other liquid metals are acceptable provided they are liquid at appropriate operating temperatures and are effective conductors of heat. In selected embodiments, during a heat conducting operation, the liquid material is circulated within the thermal interface structure 310 to enhance heat spreading and heat dissipation. In one embodiment, a width 317 of selected spaces in the number of spaces 314 is tailored to adjust the circulation flow. In one embodiment, the width 317 of at least one of the number of spaces 314 is in a range of approximately 0.0025–0.0050 cm.

Embodiments of the thermal interface structure 310 as described above provide a composite heat conducting mode of operation. In one embodiment, heat is conducted into the liquid material, while concurrently heat is conducted into the number of guide structures 312. A composite thermal conductivity of the thermal interface structure 310 can therefore be calculated with a contribution from the liquid material and a contribution from the number of guide structures 312. One advantage of using a metal material to form the number of guide structures 312 is that the heat conduction contribution from the number of guide structures 312 is high compared to other materials such as polymers or ceramics, etc. Indium metal, for example, has a thermal conductivity of approximately 82 W/mK.

In one embodiment, the number of spaces 314 form a direct interface at interface 318 with the heat spreader 320. In one embodiment, the number of spaces 314 form a direct interface at backside 332 of the integrated circuit chip 330. As illustrated in FIG. 3C, in one embodiment, the number of spaces 314 form a direct interface at both the interface 318 with the heat spreader 320, and at the backside 332 of the integrated circuit chip 330. A direct interface of the liquid material with the integrated circuit chip 330 enhances heat conduction into the liquid material from the integrated circuit chip 330 without intervening layers. Similarly, a direct interface of the liquid material with the heat spreader 320 further enhances conduction of heat within the liquid material out to the heat spreader 320.

Figure 4:
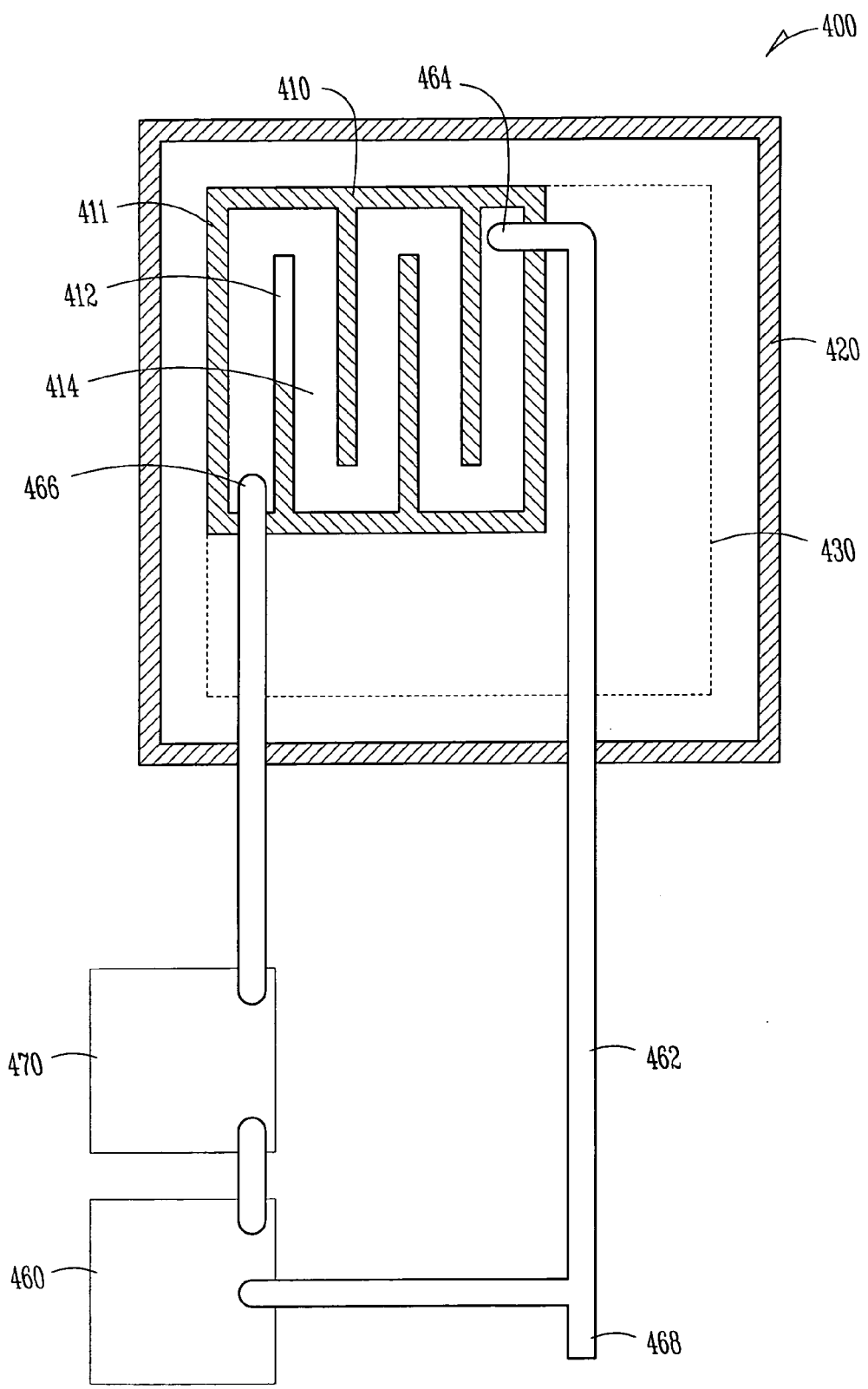
FIG. 4 illustrates a top view of an integrated circuit assembly according to one embodiment of the invention.

FIG. 4 shows a thermal interface cooling assembly 400. The cooling assembly 400 includes a thermal interface structure 410 coupled to a portion of a surface of an integrated circuit chip 430. A section of an integrated heat spreader 420 is shown surrounding the integrated circuit chip 430 and the thermal interface structure 410. Although the thermal interface structure 410 shown in FIG. 4 covers only a fraction of the surface of the integrated circuit chip 430 (such as a high heat generating area), other embodiments include a thermal interface structure 410 that entirely covers the surface of the integrated circuit chip 430.

The thermal interface structure 410 includes a perimeter seal portion 411 and a number of guide portions 412 within an area defined by the perimeter seal portion 411. In one embodiment, the perimeter seal portion 411 functions to retain an amount of liquid within spaces 414 of the thermal interface structure 410, between the integrated circuit chip 430 and the heat spreader. In one embodiment, the perimeter seal portion 411 and the number of guide portions 412 are formed integrally from a single sheet or portion of base material. Other embodiments may include a seal portion that is formed separately from the number of guide portions 412. In one embodiment, the perimeter seal portion 411 and the number of guide portions 412 are formed concurrently using a stamping or die cutting operation. In one embodiment, the perimeter seal portion 411 and the number of guide portions 412 are formed concurrently as a cold formed interface is formed on a surface such as a surface of a heat spreader as described in embodiments above. For example, a stamping die cuts the perimeter seal portion 411, and concurrently provides a load used to cold form the perimeter seal portion 411.

FIG. 4 further shows a circulation system including a pump 460 and a number of transmission lines 462. The number of transmission lines 462 are coupled to the thermal interface structure 410 at a first inlet/outlet 464 and a second inlet/outlet 466. In one embodiment, a fill port 468 is included to facilitate introduction of the liquid material to the spaces 414 during manufacture of the cooling assembly 400. In one embodiment, the fill port 468 includes a valve. In one embodiment, a heat exchanger 470 is further included. Elements such as the pump 460 and the heat exchanger 470 are shown in block diagram form in FIG. 4, and specific locations should not be implied. For example, in one embodiment, the heat exchanger 470 is integral with the pump 460. Examples of heat exchangers 470 include fluid reservoirs, devices with fins, etc.

In operation, the thermal interface structure 410 functions to both spread heat laterally across the surface of the integrated circuit chip 430 and to conduct heat away from the integrated circuit chip 430. Heat removal is accomplished using features such as circulation of the liquid material external to the thermal interface structure 410, and conduction of heat through the thermal interface structure 410 to the heat spreader.

Figure 5A:
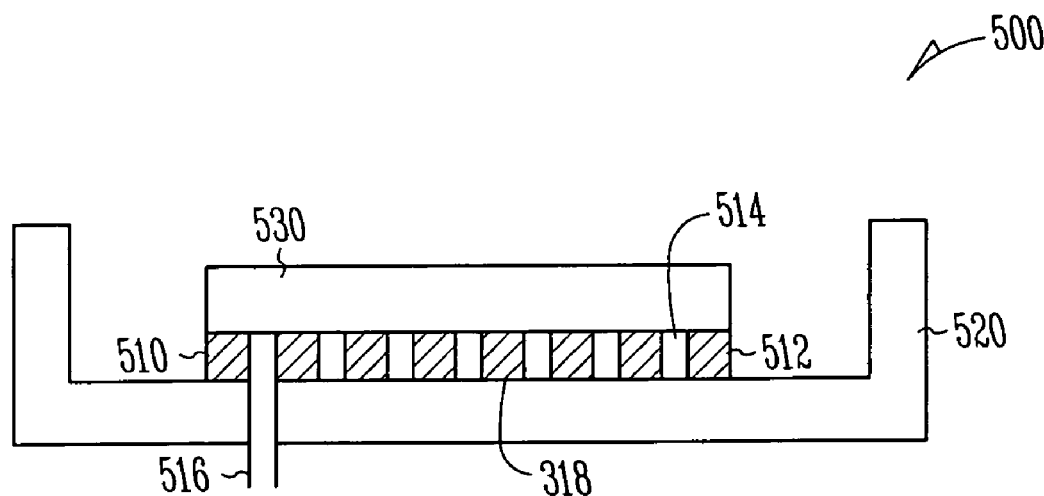
FIG. 5A illustrates a side view of an integrated circuit assembly according to one embodiment of the invention.

FIG. 5A shows one embodiment of an integrated circuit chip assembly 500. The assembly 500 includes a heat spreader 520, a thermal interface structure 510 and an integrated circuit chip 530. Similar to embodiments above, the thermal interface structure 510 includes a number of guide structures 512 and the number of spaces 514. One configuration of an inlet/outlet 516 is shown. In FIG. 5A, the inlet/outlet 516 passes through the heat spreader 520 in a direction substantially perpendicular to a main surface of the heat spreader 520.

Figure 5B:
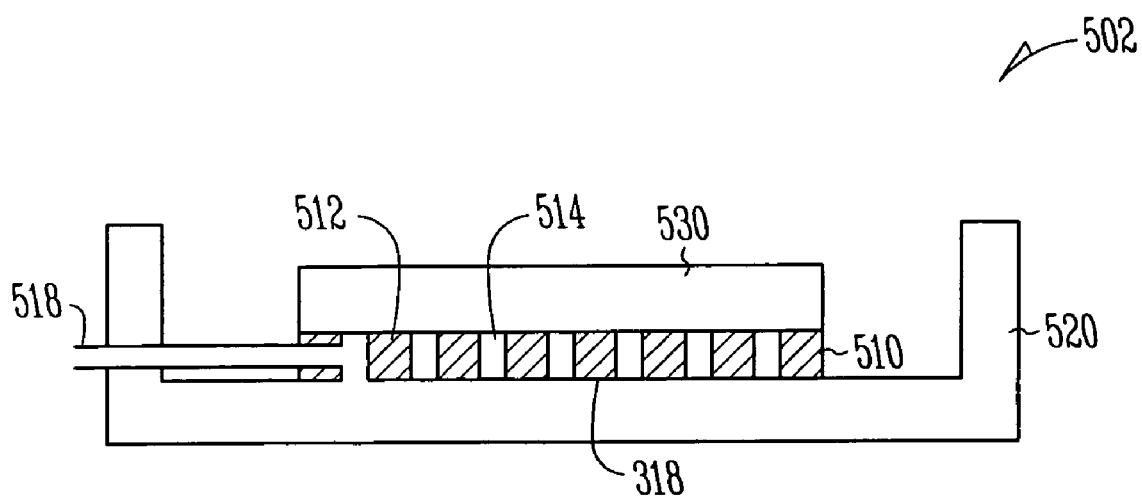
FIG. 5B illustrates another side view of an integrated circuit assembly according to one embodiment of the invention.

FIG. 5B shows another embodiment of an integrated circuit chip assembly 502. The assembly 502 includes a heat spreader 520, a thermal interface structure 510 and an integrated circuit chip 530. In FIG. 5B, an inlet/outlet 518 is shown passing through the heat spreader 520 at a side portion of the heat spreader 520. Although two possible configurations of inlet/outlet structures are shown, the invention is not so limited. One of ordinary skill in the art, having the benefit of the present disclosure will recognize that other possible configurations of inlet/outlet structures are within the scope of the invention.

CONCLUSION

Devices and methods including thermal interface structures as described above include advantages such as improved interfacial strength, and improved interfacial contact. This in turn leads to improved heat conduction away from hot areas of a chip. Embodiments described above further include advantages of composite thermal conduction and circulated liquid cooling. Embodiments are shown that require simple, low numbers of manufacturing steps and reduced thermal interface thickness.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of embodiments described above. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:
1. An integrated circuit chip assembly, comprising:
an integrated circuit chip;
a heat spreader;
a thermal interface structure, including a perimeter seal portion, the seal portion coupled between the heat spreader and at least a portion of a surface of the integrated circuit chip; and
wherein at least one interface of the perimeter seal portion includes cold formed features.

2. The integrated circuit chip assembly of claim 1, wherein the thermal interface structure further includes a liquid material located within the perimeter seal portion and between the integrated circuit chip and the heat spreader.

3. The integrated circuit chip assembly of claim 2, wherein the liquid material is in direct contact with both the integrated circuit chip and the heat spreader.

4. The integrated circuit chip assembly of claim 2, wherein the liquid material includes liquid gallium metal.

5. The integrated circuit chip assembly of claim 1, further including a number of guide portions within the perimeter seal portion.

6. The integrated circuit chip assembly of claim 5, wherein the guide portions form longitudinal spaces having widths of approximately 0.0025–0.0050 cm.

7. The integrated circuit chip assembly of claim 1, wherein the perimeter seal portion is formed from indium.

8. The integrated circuit chip assembly of claim 1, wherein at least one interface of the perimeter seal portion further includes an intermetallic compound formed from a first and second mating material at the interface.

9. The integrated circuit chip assembly of claim 1, wherein the thermal interface structure has a thickness of approximately 0.0025–0.0050 cm.

* * * * *

UNITED STATES PATENT AND TRADEMARK OFFICE
CERTIFICATE OF CORRECTION

PATENT NO.       : 7,030,485 B2
APPLICATION NO.  : 10/607734
DATED            : April 18, 2006
INVENTOR(S)      : Houle et al.

It is certified that error appears in the above-identified patent and that said Letters Patent is hereby corrected as shown below:

On the title page, in item (56), under "U.S. Patent Documents", in column 2, line 7, after "Daves et al." insert - - 361/719 - -.

On the title page, in item (56), under "U.S. Patent Documents", in column 2, line 11, after "Jadhav et al." insert - - 361/708 - -.

Signed and Sealed this

Twenty-second Day of August, 2006

JON W. DUDAS
*Director of the United States Patent and Trademark Office*